United States Patent
Prakuzhy et al.

(10) Patent No.: US 11,430,719 B2
(45) Date of Patent: Aug. 30, 2022

(54) SPOT-SOLDERABLE LEADS FOR SEMICONDUCTOR DEVICE PACKAGES

(71) Applicant: TEXAS INSTRUMENTS INCORPORATED, Dallas, TX (US)

(72) Inventors: Manu A. Prakuzhy, Allen, TX (US); Siva P. Gurrum, Allen, TX (US); Daryl R. Heussner, Allen, TX (US); Stefan W. Wiktor, Raleigh, NC (US); Ken Pham, San Jose, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 371 days.

(21) Appl. No.: 16/455,583

(22) Filed: Jun. 27, 2019

(65) Prior Publication Data
US 2019/0318983 A1    Oct. 17, 2019

Related U.S. Application Data

(62) Division of application No. 15/487,186, filed on Apr. 13, 2017, now Pat. No. 10,607,927.
(Continued)

(51) Int. Cl.
H01L 23/495    (2006.01)
H01L 23/31     (2006.01)
H02M 3/158     (2006.01)

(52) U.S. Cl.
CPC .... *H01L 23/49558* (2013.01); *H01L 23/3114* (2013.01); *H01L 23/49503* (2013.01); *H01L 23/49548* (2013.01); *H01L 23/49562* (2013.01); *H01L 23/49575* (2013.01); *H01L 23/49582* (2013.01); *H01L 23/49586* (2013.01);
(Continued)

(58) Field of Classification Search
None
See application file for complete search history.

(56) References Cited

U.S. PATENT DOCUMENTS 6,577,012 B1 * 6/2003 Greenwood ........ H01L 21/4842
                                                    257/766
7,087,462 B1    8/2006 Park et al.
(Continued)

FOREIGN PATENT DOCUMENTS

CN    101246938    8/2008
CN    101719487    6/2010
(Continued)

OTHER PUBLICATIONS

China National Intellectual Property Search Report Application No. 2017107956700 dated Sep. 18, 2021, 2 pages.

*Primary Examiner* — Benjamin P Sandvik
(74) *Attorney, Agent, or Firm* — Dawn Jos; Charles A. Brill; Frank D. Cimino

(57) ABSTRACT

A semiconductor device that has at least one semiconductor chip attached to a leadframe made of sheet metal of unencumbered full thickness. The leadframe has leads of a first subset that alternate with leads of a second subset. The leads of the first and second subsets have elongated straight lead portions that are parallel to each other in a planar array. A cover layer of insulating material is located over portions of un-encapsulated lead surfaces. The portions of the leads of the first and second subsets that don't have the cover layer have a metallurgical configuration that creates an affinity for solder wetting.

6 Claims, 4 Drawing Sheets

Related U.S. Application Data

(60) Provisional application No. 62/385,499, filed on Sep. 9, 2016.

(52) U.S. Cl.
CPC ..... *H02M 3/158* (2013.01); *H01L 2924/1032* (2013.01); *H01L 2924/1033* (2013.01); *H01L 2924/1037* (2013.01); *H01L 2924/10253* (2013.01); *H01L 2924/10271* (2013.01); *H01L 2924/10329* (2013.01); *H01L 2924/1305* (2013.01); *H01L 2924/1306* (2013.01); *H01L 2924/13091* (2013.01); *H01L 2924/14* (2013.01)

(56) References Cited

U.S. PATENT DOCUMENTS

| | | | |
|---|---|---|---|
| 7,934,313 B1 | 5/2011 | Lin et al. | |
| 8,604,624 B2 | 12/2013 | Kim et al. | |
| 8,803,300 B2 | 8/2014 | Bathan et al. | |
| 9,941,233 B2 | 4/2018 | Matsubara et al. | |
| 2005/0133896 A1* | 6/2005 | Liu | H01L 23/3107 257/678 |
| 2006/0001134 A1* | 1/2006 | Sun | H01L 23/3107 257/676 |
| 2011/0157851 A1* | 6/2011 | Lin | H01L 23/3128 361/757 |
| 2012/0149154 A1 | 6/2012 | McMillan et al. | |
| 2013/0125393 A1* | 5/2013 | You | H01L 23/49548 29/840 |
| 2013/0334674 A1 | 12/2013 | Zheng | |

FOREIGN PATENT DOCUMENTS

| | | |
|---|---|---|
| CN | 103617971 | 3/2014 |
| CN | 103681585 | 3/2014 |
| EP | 0989608 | 3/2000 |

\* cited by examiner

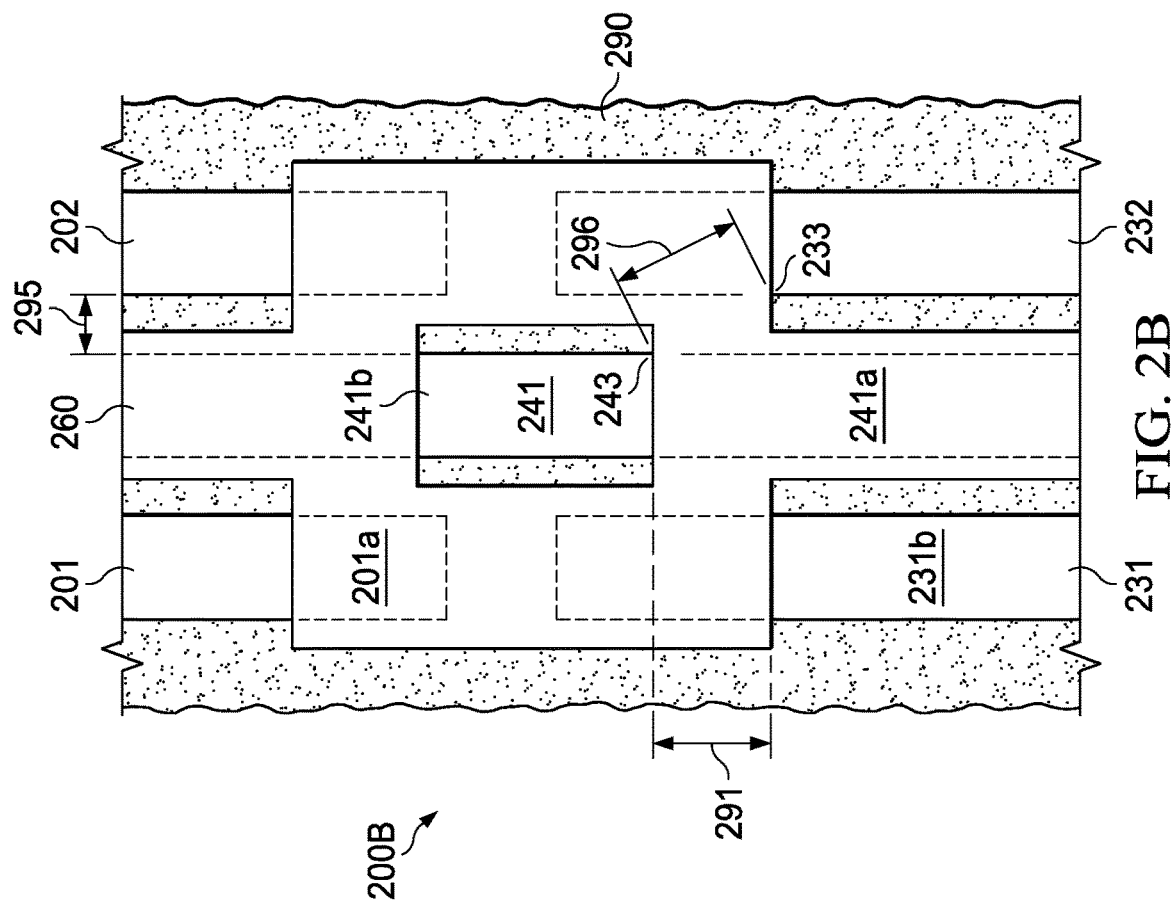
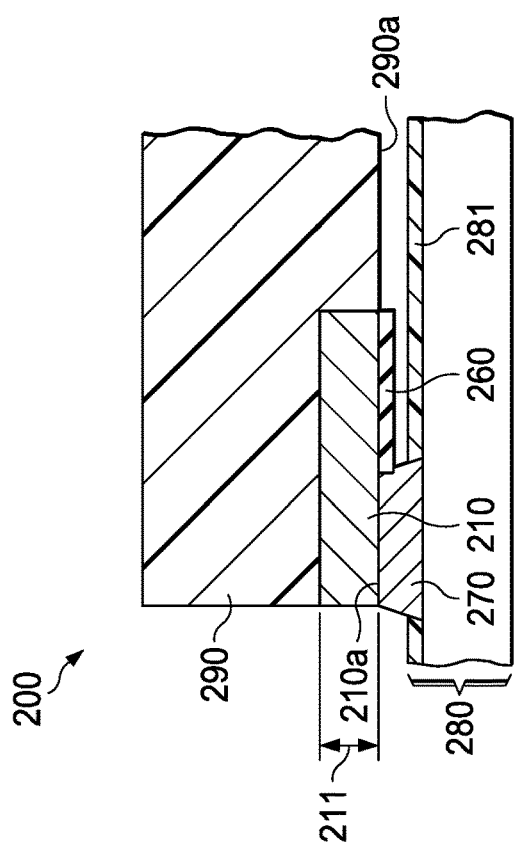
FIG. 2B
FIG. 2A

SPOT-SOLDERABLE LEADS FOR SEMICONDUCTOR DEVICE PACKAGES

CROSS REFERENCE TO RELATED APPLICATIONS

This application is a divisional of U.S. patent application Ser. No. 15/487,186 filed Apr. 13, 2017 and claims the benefit of and priority under U.S.C. § 119(e) of U.S. Provisional Application 62/385,499, "Semiconductor Device Package Having Spot-Soldering for Leads of Low Resistance and Narrow Spacing", filed Sep. 9, 2016), the contents of all are Incorporated by reference in their entirety.

FIELD

Embodiments of the invention are related in general to the field of semiconductor devices and processes, and more specifically to the structure and the method of making semiconductor device packages.

DESCRIPTION OF RELATED ART

Electronic products have, at their core, printed circuit boards to assemble and interconnect the needed semiconductor devices, power supplies, passive components, control devices, and display devices. Today, an increasing number of these electronic products, such as those that are used in smartphones, electronic cameras, portable computers, automobiles and airplanes are subject to the market trends of higher speed, lower weight, and shrinking product outlines. Consequently, the size, weight, and space required by the printed circuit boards are important.

In order to shrink board outlines, concerted efforts are expended to shrink the individual parts assembled on a board, such as the packages of semiconductor devices and passive components. In addition, a stacking of integrated circuit chips and passive components is widely practiced. However, it is becoming more difficult to provide enough thermal conductors to dissipate the heat generated by the high density leads that route signals and conduct high currents. Furthermore, there are conflicting product requirements for the metallic leadframes that are used in semiconductor products. For example, one product requirement aims for a tighter density of signal leads while another product requirement aims for stronger power leads and associated areas for heat dissipation. Fine lines and dense spacing are technically possible with thin reduced-thickness leadframes (so-called half-etched leadframes), but those leadframes may become too fragile to handle.

A product example under market pressure for scaling downward is the popular family of Power Block devices that are power switching devices for converting a first DC voltage to a second DC voltage. Particularly suitable for power delivery requirements, the Power Block 121 has two power MOS field effect transistors (FETs) connected in series and coupled together by a common switch node, as Illustrated in the circuit diagram of FIG. 1A. A control FET 110 is connected between a supply voltage $V_{IN}$ 150 and a switch node SW (output filter) 140. The switch node 140 is also tied to an inductor 161 (serving as the energy storage of the power supply circuit) and an output voltage $V_{OUT}$ 160. Furthermore, a synchronous FET 120 is connected between the switch node 140 and ground potential (PGND) 130. The $V_{IN}$, PGND, and SW connections of the power switching device have to use metal leads, such as lead 100 in FIG. 1B, that are able to carry high amounts of current. The metal leads also need to be closely spaced to each other (for device miniaturization purposes) and configured for solder 170 attachment to a printed circuit board 180.

FIG. 1C shows the bottom view of a portion of a commercially available molded package 190. The view includes metallic input leads 101 and 102, metallic ground leads 131 and 132, and metallic switch node lead 141. In today's technology of FIG. 1C, the metal leads include some portions that have half-etched metal (101a, 102a, 131a, 132a, 141a), and other portions that have a full metal thickness (101b, 102b, 131b 132b, 141b). The portions with a full metal thickness are intended to be exposed for solder attachment.

FIG. 1B also illustrates the usage of an exemplary half-etched metal lead in conjunction with the molding compound of plastic packages. Considering an exemplary metal lead 100, FIG. 1B illustrates that the half-etched portions 100b of the metal lead may be covered by molding compound 190b so that the molding compound surface 190a is coplanar with the surface 100a of the un-etched portion (i.e. the full metal portion) of the metal lead 100. Consequently, the surface 100a of the full metal portion is available for attachment by solder 170 to a printed circuit board 180.

Since metal leads 100 with half-etched portions 100b allow the coverage of the half-etched portions by the Insulating molding compound 190b, it is feasible to achieve narrow lead spacing 195 of the metallic leads as well as narrow pin spacing 196 of the metallic leads. Note that the term "lead spacing" refers to the space between metal leads inside the device package and the term "pin spacing" refers to the space between the exposed lead portions that are often soldered to a board.

BRIEF DESCRIPTION OF THE DRAWINGS

FIG. 2A depicts a cross section of a portion of a packaged Power Block device soldered onto a printed circuit board, according to an embodiment of the invention.

FIG. 2B shows a bottom view of a portion of a packaged Power Block device.

DETAILED DESCRIPTION OF PREFERRED EMBODIMENTS

Figure 1C:
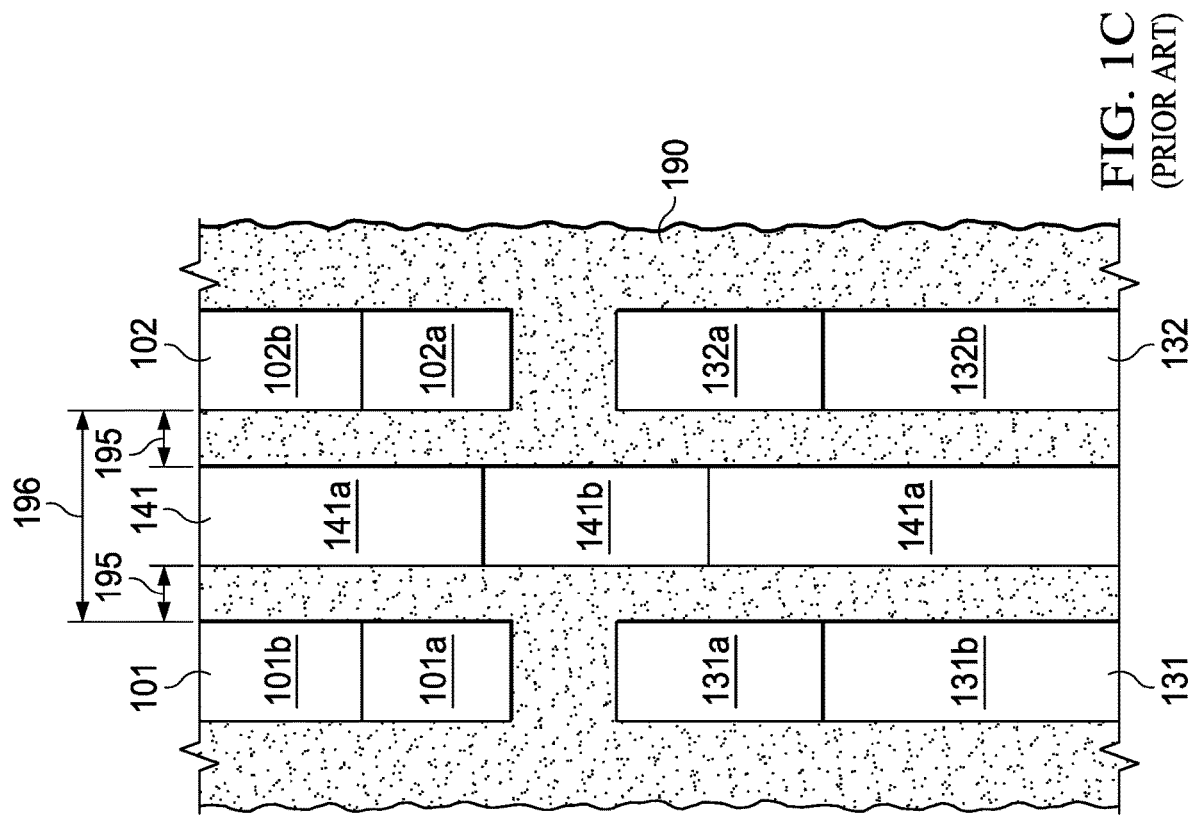
FIG. 1C illustrates a bottom view of a portion of a packaged Power Block, according to Prior Art.
Figure 1A:
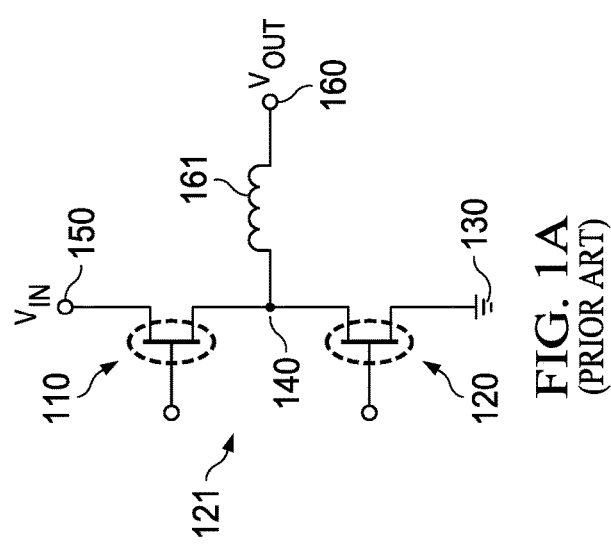
FIG. 1A is a circuit diagram of a Power Block device for power supplies including two coupled field effect transistors, according to Prior Art.
Figure 1B:
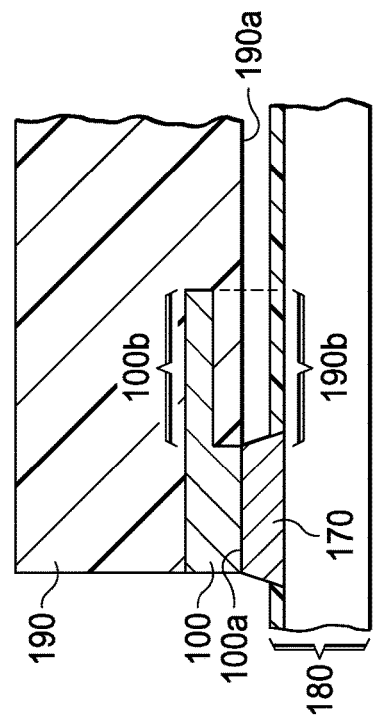
FIG. 1B shows a cross section of a portion of a packaged Power Block device soldered onto a printed circuit board, according to Prior Art.

A power switching device—or Power Block device—converts a first DC voltage to a second DC voltage. Particularly suitable for power delivery requirements are Power Blocks with two semiconductor chips such as two power MOS field effect transistors (FETs) connected in series and coupled together by a common switch node. In these power devices, the connection from the first (control) FET to a supply voltage $V_{IN}$, the connection from the control FET to a switch node SW, the connection from the switch node to an output voltage $V_{OUT}$ and to a second (synchronous) FET, and the connection from the synchronous FET to a ground potential (PGND) use metal leads that are able to carry high amounts of current. As another requirement, the leads need to be closely spaced to each other for device miniaturization purposes. Moreover, the leads need to be configured for solder attachment to printed circuit boards.

The market trend for semiconductor devices pushes for ever higher frequencies for DC-DC converters. Since the on-resistance of a converter is a defining factor for frequency, the Applicant recognized that leadframe resistance and copper routing layer resistance can be a significant contributor to the total on-resistance of the device. An approach to lower the on-resistance (and thus increase the device frequency) is to reduce the ohmic resistance of the package leads as well as reduce the lead spacing and pin spacing of the device leads.

The Applicant also realized that the ohmic resistance of the package leads can be reduced by the unencumbered full thickness of the metal lead (i.e. discontinue the usage of half-etched leads). Consequently, the common practice of covering half-etched lead portions with molding compound needs to be abandoned. In addition, the spacing between the leads needs to be reduced as much as possible. This latter requirement can shrink the spacing between the full-thickness leads that are exposed at the package surface to the point that the risk of electrical shorts by solder bridging between adjacent leads exceeds acceptable levels. (Solder bridging is a failure mechanism between two adjacent liquefied solder volumes when the surface wetting advances a connecting link between the solder volumes.)

The Applicant minimized the risk of solder bridging between adjacent full-thickness leads when they discovered a way to render restricted portions of adjacent leads un-wettable by solder (i.e. make the restricted portions un-solderable). In one method explained fully below, a polymer-based material is screen printed or inkjet-printed onto portions of adjacent leads. The material is then cured to create a solder-repelling mask. The solder-repelling mask is configured to separate solderable portions of adjacent leads to a safe distance to prevent solder bridging.

In another method explained fully below, the surfaces of selected lead portions are transformed to a surface energy low enough to become non-wettable by solder (and thus they are solder repellant). Such transformation to a low surface energy can be achieved by oxidizing or carbonizing the metal surface. Alternatively, compounds of metal atoms with carbon, nitrogen, sulfur, or other non-metallic elements can be formed on the surface of the selected lead portions to make them solder repellant. Again, the areas of low surface energy are configured to keep the solderable lead areas at a safe distance to prevent solder bridging.

The same distribution of wettable and non-wettable areas is achieved for leads that start with a non-wettable surface by selective plating on metal lead portions with high surface energy plating.

In yet another method explained fully below, insulator-filled grooves are created across the surface of leads. The insulator-filled groves limit solder spreading across the lead surface. The insulator-filled grooves are selected so that the shortest distance from the solder-allowed area of a first lead to the nearest solder-allowed area of an adjacent second lead is the smallest spacing allowed between pins by applicable device design rules.

FIGS. 2A and 2B illustrate a first embodiment of the invention. FIG. 2A shows the cross section of a Power Block device and FIG. 2B displays a bottom view of another portion of a Power Block device. In FIG. 2A, a portion of a packaged Power Block device is generally designated 200. The packaged Power Block device Includes a portion of a metallic lead 210 that is representative of any lead employed in a Power Block device (such as the leads shown in FIG. 2B). Metallic lead 210 has an unencumbered full thickness 211 throughout. As an example, lead 210 may be one of the leads of a leadframe made that is from sheet metal. For cost-effective manufacturing and to enable batch-processing, the leadframes are preferably made as a strip that includes a plurality of leadframes. A strip is stamped or etched from a flat sheet of metal that is selected from a group including copper, copper alloys, aluminum, iron-nickel alloys, and Kovar™. When the metal sheet is made of copper, the preferred thickness of the sheet Is between 100 and 300 μm. For some applications, the metal sheet may be thicker or thinner. Moreover, at least one semiconductor chip (such as the power field effect transistor (FET) described above) is attached to the leadframe. As already stated, lead 210 of FIG. 2A has an unencumbered full thickness 211 of a leadframe lead that is stamped from a flat sheet of metal.

As FIG. 2A further illustrates, lead 210 has a surface 210a that is shown as connected by solder 270 to a substrate 280 such as a printed circuit board (PCB). The surface of PCB 280 has a solder mask 281 with a window for solder 270. Lead 210 is partially encapsulated in a package 290 of polymeric compound. The surface 290a of the package is coplanar with the surface 210a of lead 210. The polymeric compound of package 290 is preferably an epoxy-based molding compound with black color added to make the package opaque. A cover layer 260 of Insulating material Is on the lead surface 210a in order to limit the extent of solder flow and to act like a solder mask.

FIG. 2B illustrates a bottom view of a portion of a packaged Power Block device 200B before the attachment of the Power Block device onto a PCB. In FIG. 28, portions of the opaque polymeric package 290 are represented by dotted shading while the metallic leads are not shaded. FIG. 2B shows that the leads are grouped and arrayed in a first and a second subset based on the electrical functions of the leads in the circuitry of the Power Block. The leads of the first subset alternate with the leads of the second subset. Each subset includes elongated straight lead portions that are parallel to each other in a planar array. In the example of FIG. 2B, leads 201 and 202 belong to the first subset and they connect to the supply voltage $V_{IN}$. Furthermore, leads 231 and 232 also belong to the first subset and they connect to the ground potential PGND. Lead 241 belongs to the second subset and it connects to the switch node SW. As FIG. 2B shows, the leads of the first subset alternate with the leads of the second subset. The subsets have elongated straight lead portions that are positioned parallel to each other in a planar array (i.e. in a common plane).

The array of straight lead portions of the first and second subsets are located at the package surface. FIG. 2B displays those un-encapsulated straight lead portions that are coplanar with the surface of the compound of package 290. FIG. 2B further displays the geometrical configuration of the cover layer 260 of insulating material that is located on the device surface. The cross section of cover layer 260 (that rests on lead surfaces) is shown in FIG. 2A. Note that FIG. 2B depicts with dashed outlines the portions of the leads that are buried under cover layer 260.

As can be seen in FIG. 2B, cover layer 260 covers portions of the un-encapsulated lead surfaces and overlaps onto adjacent packaging compound. Cover layer 260 is configured so that the covered portions of the leads of the first subset alternate with adjacent un-covered portions of the leads of the second subset. Similarly, the covered lead portions of the second subset alternate with adjacent un-covered lead portions of the first subset. As an example, the covered portion 201a of lead 201 of the first subset Is alternating with the adjacent un-covered portion 241b of lead 241 of the second subset. And concurrently, the covered portion 241a of the second subset is alternating with the adjacent un-covered portion 231B of lead 231 of the first subset. As a consequence of this alternating coverage, layer 260 has a geometrical configuration resembling a frame or a window.

The un-covered lead portions of the first and second subsets have a metallurgical configuration creating an affinity for solder wetting. Consequently, layer 260 has a geometry that safely prevents solder wicking by adjacent solder connections. In FIG. 2B, the closest proximity of adjacent solder connections is designated 296. As FIG. 2B Indicates, distance 296 is the hypotenuse of a rectangular triangle with one small triangle side being the lead spacing 295 and the other small triangle side being the width 291 of the insulating cover layer 260. When safe wicking distance 296 is determined from experience, lead spacing 295 can be minimized by enlarging width 291 of the insulating cover layer 260.

In another approach to obtain a suitable configuration of cover layer 260, the boundaries of the lead portions of adjacent first and second sets are considered. Specifically, the lead boundaries are selected so that the shortest distance 296 from the border 233 of an un-encapsulated lead of the first set to the nearest border 243 of an un-encapsulated lead of an adjacent second set is the smallest pin spacing 295 allowed by applicable design rules of the device.

As mentioned previously, the market trend for semiconductor devices is higher frequencies for DC-DC power converters. An approach to increasing the frequency is lowering the on-resistance by reducing the ohmic resistance of the package leads and reducing the lead spacing and pin spacing. It is well known that the total on-resistance $R_{on}$ of two FETs with drain-to-source on-resistances $R_{on1}$ and $R_{on2}$ can be made smaller than the smallest on-resistance of each individual transistor when the FETs are electrically connected "in parallel". For negligible parasitic resistances of the interconnections, $R_{on}$ is obtained by $$1/R_{on}=1/R_{on1}+1/R_{on2}.$$

For two FETs with equal on-resistance ($R_{on1}=R_{on2}$), the parallel positioning of those transistors reduces the total on-resistance $R_{on}$ by half: $R_{on}=\frac{1}{2} R_{on1}$. Moreover, the on-resistance depends on the chip size of the FET. As an example, for a FET with a chip area of 5 mm$^2$, the on-resistance may be about 2.0 mΩ. If two of these FETs having equal area are interconnected in parallel, they have a total on-resistance $R_{on}$ of about 1.0 mΩ when the parasitic resistances of the interconnections can be neglected. Otherwise, the on-resistance can realistically be expected to be about 1.1 mΩ.

An analogous relationship holds for parallel arrangement of on-impedances. When a FET with on-impedance $Z_{on1}$ is connected in parallel to a FET with on-impedance $Z_{on2}$, and further the phase difference of the current relative to the voltage is the same in both transistors ($\varphi_1=\varphi_2$), the total on-impedance $Z_{on}$ is given by $$1/Z_{on}=1/Z_{on1}+1/Z_{on2}.$$

If the phase difference between current and voltage is not the same in both transistors ($\varphi_1 \neq \varphi_2$), the following relationship holds:

$$1/Z_{on}=[(1/Z_{on1})^2+(1/Z_{on2})^2+2/(Z_{on1} \cdot Z_{on2}) \cdot \cos(\varphi_1-\varphi_2)]^{1/2}.$$

The reciprocal value $1/Z_{on}$ of the Impedance for parallel connection Is usually smaller than the sum $1/Z_{on1}+Z_{on2}$ of the reciprocal discrete impedances. For individual devices, the effort to create low on-impedance FETs is focused on each and every additional fraction of an ohm. Therefore, even small parasitic impedances have to be counted—especially for the interconnecting leads of an assembly board.

Cover layer 260 is made of insulating material selected from a group Including polymeric-based compounds, polyimide, solder mask, silicon nitride, silicon dioxide, and silicon carbide. Preferably, the selected polymeric-based compounds and polyimides can be printed by inkjet or screen technologies. When the polymeric-based compounds and polyimides are cured and hardened, they can serve as masks that are comparable to the solder mask 281 on PCB 280 shown in FIG. 2A.

Figure 3B:
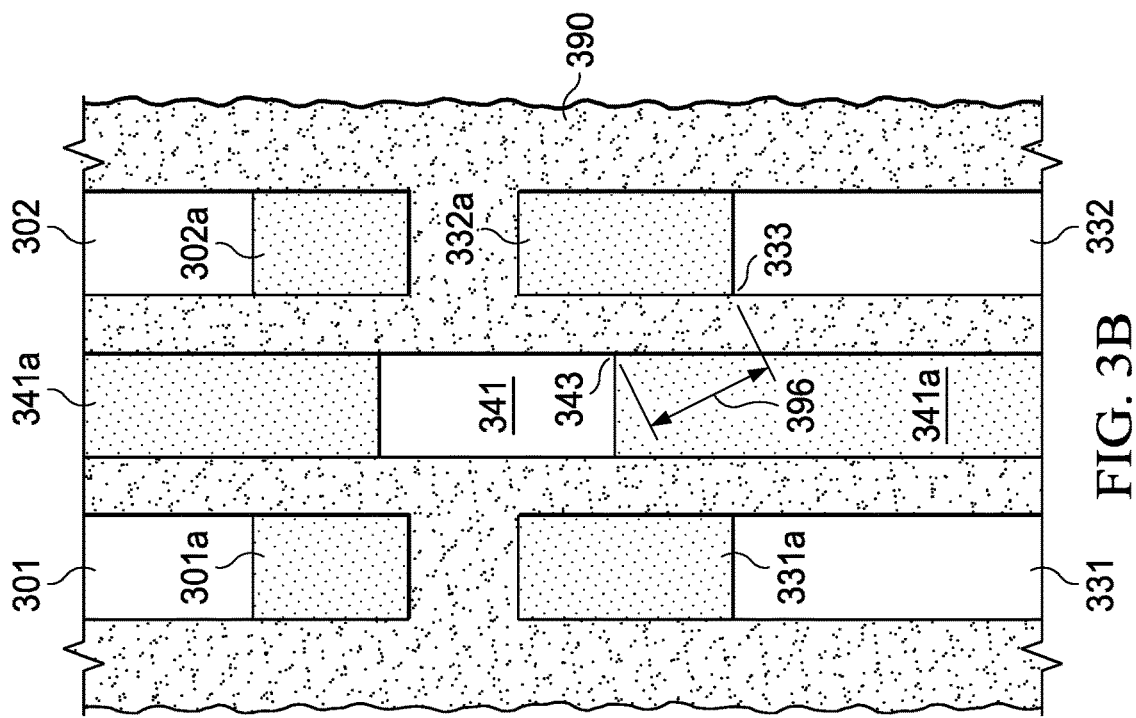
FIG. 3B depicts a bottom view of a portion of a packaged Power Block device.
Figure 3A:
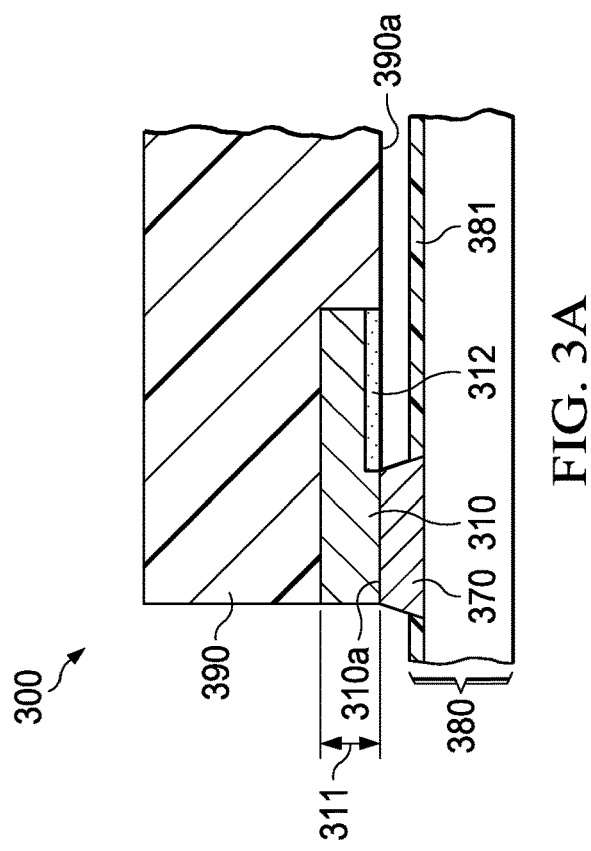
FIG. 3A illustrates a cross section of a portion of a packaged Power Block device soldered onto a printed circuit board, according to another embodiment of the invention.

FIGS. 3A and 3B illustrate another exemplary embodiment of the invention. FIG. 3A shows a cross section of a portion of a Power Block device. FIG. 3B displays a bottom view of another portion of a Power Block device. The portion depicted in FIG. 3A, and generally designated 300, includes a metallic lead 310 that has an unencumbered full thickness 311 throughout. Lead 310 may be an example lead belonging to a leadframe that is made from sheet metal such as copper, copper alloys, aluminum, iron-nickel alloys, and Kovar™. When the metal sheet is made of copper, the preferred thickness of the sheet is between 100 and 300 μm. For some applications, the sheet may be thicker or thinner. Moreover, at least one semiconductor chip (such as the power field effect transistor (FET) described above) is attached to the leadframe. In FIG. 3A, lead 310 has a first surface 310a that extends to a portion 312 of the surface of encapsulating package 390. Surface 310a is shown as connected by solder 370 to a substrate 380 such as a printed circuit board (PCB). In FIG. 3A, the surface of PCB 380 has a solder mask 381 with a window for solder 370. Lead 310 is partially encapsulated in the package 390 that is preferably an epoxy-based molding compound that is made opaque by black color. Another portion 390a of the surface of the package is also coplanar with the surface 310a of lead 310.

FIG. 3B Illustrates a bottom view of a portion of a packaged Power Block before the attachment of the Power Block device onto a PCB. In FIG. 3B, the opaque package 390 is shaded and the metallic leads are not shaded. FIG. 3B shows that the leads are grouped and arrayed in a first and a second subset based on the electrical functions of the leads in the circuitry of the Power Block. The leads of the first subset alternate with the leads of the second subset. Both subsets include elongated straight lead portions that are parallel to each other in a planar array. In the example of FIG. 3B, leads 301 and 302 belong to the first subset and they connect to a supply voltage $V_{IN}$ of the Power Block. Furthermore, leads 331 and 332 also belong to the first subset and they connect to a ground potential PGND of the Power Block. Lead 341 belongs to the second subset and it connects to the switch node SW of the Power Block. As FIG. 3B shows, the leads of the first subset alternate with the leads of the second subset. The subsets have elongated straight lead portions that are positioned parallel to each other in a planar array (i.e. in a common plane).

The array of straight lead portions of the first and second subsets are located at the package surface. FIG. 3B displays the un-encapsulated lead surfaces that are coplanar with the surface of the compound package 390. The bottom view of FIG. 3B and the cross section of FIG. 3A indicate by small dotting that certain portions of un-encapsulated lead surfaces have a layer at the surface that is characterized by a metallurgical configuration for low surface energy. The low surface energy portions are arranged so that the unlayered portions of the leads of the first subset alternate with adjacent low surface energy layered portions of the leads of the second subset. The purpose of the low surface energy layer is to inhibit the wetting of the surface by solder material.

Specifically, in FIG. 3A the low surface energy surface is designated 312. In FIG. 38, the lead portions with low surface energy are designated 301a and 302a for the $V_{IN}$-connecting leads 301 and 302, and 331a and 332a for the PGND-connecting leads 331 and 332. For the leads of the second subset, the lead portion with low surface energy is designated 341a for SW-connecting lead 341.

The processes to achieve a metallurgical configuration having low surface energy (also referred to as low surface tension) Includes the oxidation of the lead metal surface or any other process of forming metal compounds with carbon, nitrogen, sulfur, or other non-metallic elements. While metallic surfaces typically have surface energies in the order of 800 mN/m, materials such as polymers (for instance polytetrafluoroethylene) and silicone can have surface energies <20 mN/m. This range is close to the regime of liquids, which typically have surface energies between 30 and 80 mN/m and thus can be pulled to spread by the high surface energy of metals when deposited on metal surfaces. If the surface energy of a material is less than or equal to the surface energy of the fluid, the fluid will not wet the material. This feature can thus be used to create patterned barriers for controlling the flow of solder. Even when barriers have little or no physical height, the surface energy barrier will generally contain the reflowing solder within the patterned surface energy boundaries.

Alternatively, an inverse method may achieve similar results. In this inverse method, the exposed leads surfaces are originally oxidized (or they otherwise possess low surface energy) and that makes them unsuitable for soldering. Then, in a process such as plating, a thin film of high surface energy material (such as a metal) is deposited on selected portions of the low surface energy leads. As a result, the plating process renders solderable the plated lead portions having high surface energy plating. As an example, when the leads of a copper leadframe originally have copper oxide surfaces (which are notoriously difficult to solder), a plated and patterned thin film of copper, nickel, palladium, or gold will make the plated lead portions solderable.

FIG. 3B indicates the boundaries of the un-encapsulated first and second lead portions of adjacent leads with border points 333 and 343. To prevent solder wicking, the un-encapsulated lead boundaries are selected so that the shortest distance 396 between the nearest border points 333 and 343 is the smallest pin spacing allowed by applicable design rules of the device.

Figure 4:
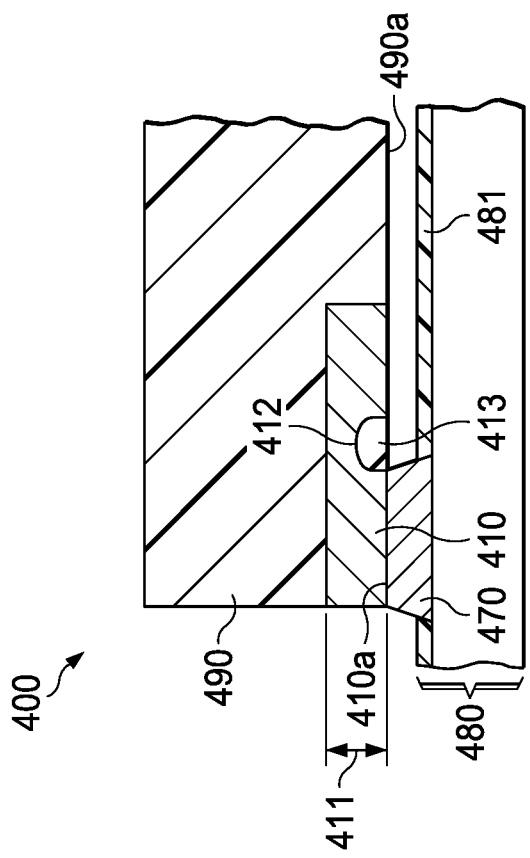
FIG. 4 shows a cross section of a portion of a packaged Power Block device soldered onto a printed circuit board, according to yet another embodiment of the invention.

FIG. 4 illustrates the concept of another exemplary embodiment of the invention. FIG. 4 shows a Power Block device portion generally designated 400. The depicted Power Block device portion includes a metallic lead 410 that initially has an unencumbered thickness 411 throughout. As an example, lead 410 may be a lead of a leadframe made from sheet metal such as copper, copper alloys, aluminum, iron-nickel alloys, and Kovar™. When the metal sheet is made of copper, the preferred thickness of the sheet is between 100 and 300 µm. For some applications, the sheet may be thicker or thinner. Moreover, at least one semiconductor chip (such as the power field effect transistor (FET) described above) is attached to the leadframe. In FIG. 4, lead 410 has a first surface 410a. A portion of surface 410a that extends to a plastic-filled groove 412 is shown as connected by solder 470 to a substrate 480 such as a printed circuit board (PCB). In FIG. 4, the surface of PCB 480 has a solder mask 481 with a window for solder 470. Lead 410 is partially encapsulated in a package 490 that is preferably an epoxy-based molding compound. The surface 490a of the package 490 is coplanar with the surface 410a of lead 410.

FIG. 4 shows that the surface 410a of lead 410 has a groove or indent 412 that Is filled with an insulator 413 such as the molding compound of package 490. Alternatively, insulator 413 may be selected from a group including polyimide, polymeric-based compounds, solder mask, silicon nitride, silicon dioxide, and silicon carbide. Insulator 413 has a surface energy low enough that it limits the spreading of solder 470 beyond the plastic-filled groove 412 that is approximately above the border of the window in solder mask 481. The plastic-filled groove 412 is shallow and narrow and thus does not substantially reduce the benefit of the unencumbered thickness 411 of lead 410.

For the embodiment shown in FIG. 4, the Power Block devices include one or more semiconductor chips with power MOS transistors that are assembled on a leadframe. The leads of a first subset alternate with the leads of a second subset. Both subsets have elongated straight lead portions that are parallel to each other in a planar array (analogous to the portion of a Power Block device leads depicted in the bottom view of FIG. 3B). The leads of the first subset belong to the input and ground connections of the first and second power MOS transistors. The leads of the second subset belong to the switch line connection between first and second transistors. The insulator-filled surface grooves 412 are located across the straight leads of the first and second subset. The surface grooves 412 are placed in locations where the shortest distance from the solder-allowed area of a first lead to the nearest solder-allowed area of an adjacent second lead is the smallest pin spacing allowed by applicable device design rules.

While this invention has been described in reference to Illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to semiconductor chips including field effect transistors, bipolar transistors, power transistors, and integrated circuits. An another example, the invention applies to chips made of silicon, silicon germanium, gallium arsenide, gallium nitride, of any other Ill-V and II-VI compound used in product manufacturing. It is therefore intended that the appended claims encompass any such modifications or embodiments.

We claim:

1. A semiconductor device comprising:
at least one semiconductor chip attached to leads of a leadframe, the leads made of sheet metal of full thickness and the leads arrayed into a first subset that alternate with a second subset, the subsets having elongated straight lead portions that are parallel to each other in a planar array;

a package of polymeric compound covering the leadframe, the planar array of the straight lead portions of the first and the second subsets are located at a surface of the package, and uncovered surfaces of the leads are coplanar with the surface of the package; and a surface layer having a metallurgical configuration for low surface energy for portions of the uncovered lead surfaces, the low surface energy layer of the leads of the first subset alternate with the low surface energy layer of the leads of the adjacent second subset, the low energy surface layer inhibiting wetting by solder material.

2. The semiconductor device of claim 1 wherein the surface layer is selected from a group of surface metal compounds including compounds with oxygen, nitrogen, carbon, sulfur.

3. The semiconductor device of claim 1 wherein the at least one semiconductor chip is a first and a second power MOS field effect transistor having input and ground connections, the semiconductor chips are assembled on the leadframe and they are encapsulated by the polymeric compound.

4. The semiconductor device of claim 1 wherein the polymeric compound of the package is an epoxy-based molding compound.

5. The semiconductor device of claim 3 wherein the semiconductor device is a Power Block, the leads of the first subset belonging to the input and ground connections of the first and second power MOS field effect transistors, and the leads of the second subset belong to a switch line connection coupled between the first and second power MOS field effect transistors.

6. The semiconductor device of claim 5 wherein boundaries of the elongated straight lead portions of the first subset and the elongated straight lead portions of the adjacent second subset are selected so that a shortest distance from a border of the un-encapsulated surface of a lead of the first subset to a nearest border of the un-encapsulated surface of a lead of the adjacent second subset is the smallest pin spacing allowed by applicable design rules of the semiconductor device.

* * * * *